(12) United States Patent
Du

(10) Patent No.: US 10,453,671 B2
(45) Date of Patent: Oct. 22, 2019

(54) COMBINED STRUCTURE OF FLEXIBLE SEMICONDUCTOR DEVICE PACKAGE AND METHOD OF TRANSPORTING THE FLEXIBLE SEMICONDUCTOR DEVICE

(71) Applicant: SAMSUNG ELECTRONICS CO., LTD., Suwon-si, Gyeonggi-Do (KR)

(72) Inventor: Maohua Du, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 52 days.

(21) Appl. No.: 15/798,665

(22) Filed: Oct. 31, 2017

(65) Prior Publication Data

US 2018/0261446 A1  Sep. 13, 2018

(30) Foreign Application Priority Data

Mar. 9, 2017 (CN) .......................... 2017 1 0137708

(51) Int. Cl.
*H01L 21/00* (2006.01)
*H01L 21/02* (2006.01)
(Continued)

(52) U.S. Cl.
CPC ........ *H01L 21/02016* (2013.01); *H01L 21/56* (2013.01); *H01L 21/6835* (2013.01); *H01L 23/14* (2013.01); *H01L 23/5387* (2013.01); *H01L 23/3128* (2013.01); *H01L 23/49816* (2013.01); *H01L 23/562* (2013.01); *H01L 2221/68304* (2013.01); *H01L 2224/48227* (2013.01); *H01L 2924/15311* (2013.01); *H01L 2924/181* (2013.01); *H01L 2924/3511* (2013.01)

(58) Field of Classification Search
None
See application file for complete search history.

(56) References Cited

U.S. PATENT DOCUMENTS 5,901,041 A   5/1999  Davies et al.
6,027,958 A   2/2000  Vu et al.
(Continued)

FOREIGN PATENT DOCUMENTS

CN   1282983 A    2/2001
CN   101127342 A  2/2008
(Continued)

OTHER PUBLICATIONS

Chinese Office Action dated Nov. 23, 2018 cited in Chinese Application No. 201710137708.5.

*Primary Examiner* — Reema Patel
(74) *Attorney, Agent, or Firm* — Volentine, Whitt & Francos, PLLC

(57) ABSTRACT

A carrier or manufacturing unit includes a combination of a flexible semiconductor device package, adhesive disposed on the flexible semiconductor device package and a rigid substrate disposed on the adhesive. The flexible semiconductor device package may be protected during transport and/or assembly by the rigid substrate. In a method of manufacturing an electronic product such as wearable technology that requires a flexible semiconductor device package, the unit can be transported to a work station and physically and/or electrically connected to another/other component(s) of the technology. Then the rigid substrate is removed.

12 Claims, 2 Drawing Sheets

(51) Int. Cl.
*H01L 23/14* (2006.01)
*H01L 23/538* (2006.01)
*H01L 21/56* (2006.01)
*H01L 21/683* (2006.01)
H01L 23/31 (2006.01)
H01L 23/00 (2006.01)
H01L 23/498 (2006.01)

(56) References Cited

U.S. PATENT DOCUMENTS

| | | | |
|---|---|---|---|
| 6,111,324 | A | 8/2000 | Sheppard et al. |
| 6,232,650 | B1 | 5/2001 | Fujisawa et al. |
| 6,392,143 | B1 | 5/2002 | Koshio |
| 6,590,275 | B2 | 7/2003 | Fujisawa et al. |
| 8,691,702 | B2 | 4/2014 | Geerpuram et al. |
| 8,951,848 | B2 | 2/2015 | Chou et al. |
| 9,349,684 | B2 | 5/2016 | Kim et al. |
| 9,425,169 | B2 | 8/2016 | Kim |
| 9,640,596 | B2 | 5/2017 | Hsieh et al. |
| 2004/0149489 | A1 | 8/2004 | Ferrando et al. |
| 2004/0223328 | A1 | 11/2004 | Lee et al. |
| 2006/0209218 | A1* | 9/2006 | Lee .......................... G04G 9/00 349/1 |
| 2014/0042649 | A1* | 2/2014 | Ke ...................... H01L 27/1218 264/1.36 |
| 2016/0014912 | A1 | 1/2016 | Shih |
| 2016/0093545 | A1 | 3/2016 | Lee et al. |

FOREIGN PATENT DOCUMENTS

| | | |
|---|---|---|
| CN | 101290921 A | 10/2008 |
| CN | 202153541 U | 2/2012 |
| CN | 103354239 A | 10/2013 |
| CN | 103579128 A | 2/2014 |
| CN | 104167429 A | 11/2014 |
| CN | 105280562 A | 1/2016 |
| CN | 105336875 A | 2/2016 |
| CN | 106068548 A | 11/2016 |
| JP | 1994252208 A | 9/1994 |
| KR | 1020020057358 | 7/2002 |
| KR | 101565016 | 10/2015 |

* cited by examiner

COMBINED STRUCTURE OF FLEXIBLE SEMICONDUCTOR DEVICE PACKAGE AND METHOD OF TRANSPORTING THE FLEXIBLE SEMICONDUCTOR DEVICE

PRIORITY STATEMENT

This application claims the benefit of priority under 35 U.S.C. § 119 based on Chinese Patent Application No. 201710137708.5 filed on Mar. 9, 2017 and the entire contents of which are hereby incorporated by reference in their entirety.

BACKGROUND

1. Field

The inventive concept relates to flexible semiconductor device packages and to a method of manufacturing an electronic product, such as wearable technology, including a flexible semiconductor device package.

2. Description of the Related Art

The numbers of wearable electronic devices, i.e., wearable devices that are used while being worn on the wrist, neck, head, for example, of a human body are increasing. However, most of the surfaces of the human body are not flat. Thus, wearable electronic devices must have relatively great flexibility to adapt to different contours of the human skin which themselves can change to a certain extent in work environments. That is, end users require wearable electronic devices to be resilient when being put on and during use. To this end, semiconductor packages of wearable electronic devices are flexible. Consequently, such semiconductor packages may be permanently deformed while being assembled and being transported, thus causing the semiconductor packages to become defective, and reducing the yield of wearable electronic devices manufactured from the same.

SUMMARY

According to the inventive concept, there is provided a semiconductor device carrier unit including a combination of a flexible semiconductor device package, adhesive disposed on the flexible semiconductor device package, and a rigid substrate disposed on the adhesive and adhered to the flexible semiconductor device package by the adhesive.

According to the inventive concept, there is also provided a method of manufacturing an electronic product, including providing a manufacturing unit including a flexible semiconductor device package and a rigid substrate attached to the flexible semiconductor device package by adhesive, assembling the manufacturing unit to one or more other components constituting the electronic product, and subsequently releasing the rigid substrate from the flexible semiconductor device package by treating the adhesive.

According to the inventive concept, there is also provided a method of manufacturing an electronic product, including providing a semiconductor device package including a base film, at least one semiconductor chip disposed on the base film, external terminals disposed on the base film and electrically connected to each semiconductor chip, and an encapsulant disposed on the base film and covering the semiconductor chip(s), attaching a plate to the semiconductor device package along a surface of the encapsulant to thereby form a semiconductor device carrier unit in which flexing of the semiconductor package is suppressed, transporting the semiconductor device carrier unit to a work station, assembling the semiconductor device carrier unit to one or more other components of the electronic product at the work station, and subsequently removing the plate from the semiconductor device package.

DETAILED DESCRIPTION

Figure 1:
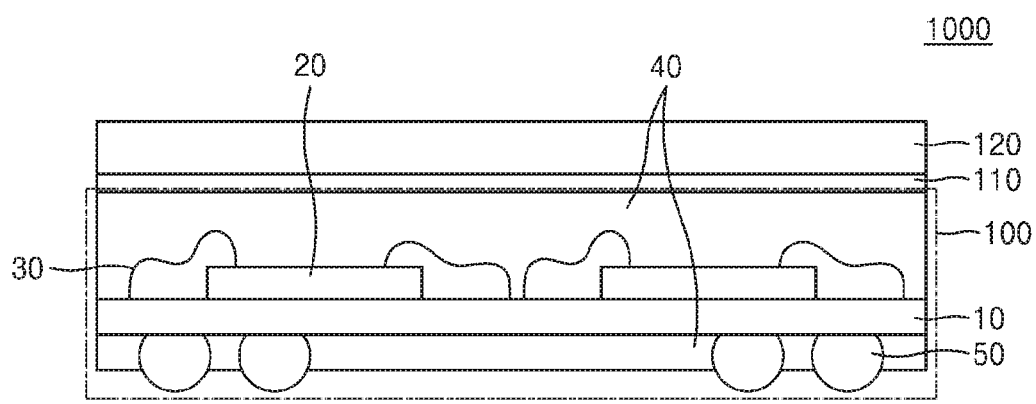
FIG. 1 is a cross-sectional view of an example of an article of manufacture including a flexible semiconductor device package according to the inventive concept.

Various examples of the inventive concept will be described more fully hereinafter with reference to the accompanying drawings. The inventive concept may, however, be embodied in many different forms and should not be construed as limited to the examples described in detail herein. In the drawings, the size and relative sizes of layers and regions may be exaggerated for clarity. In addition, descriptions of well-known features and their functions may be omitted for increased clarity and conciseness.

In an example of the inventive concept, an adhesive is disposed on a flexible semiconductor device package, and a rigid substrate is disposed on the adhesive so that the rigid substrate is bonded to the flexible semiconductor device package through the adhesive. As a result, an article of manufacture including a combination of the flexible semiconductor device package and the rigid substrate is provided. After transportation of and/or assembly of the flexible semiconductor device package into a product, e.g., a wearable electronic device, the rigid substrate and the flexible semiconductor device package in the combined structure of the flexible semiconductor device package are separated from one another by a method of treating the adhesive which will be described later on in more detail.

Here, and in the description that follows, the combination of the flexible semiconductor device package and rigid substrate as joined by adhesive may be referred to as a semiconductor device carrier or manufacturing unit or semiconductor device carrier for short. According to the inventive concept, the semiconductor device carrier may temporarily protect the flexible semiconductor device package from excessive bending and deformation during the transporting and assembling of the flexible semiconductor device package into an electronic device, thereby facilitating the assembly and transportation processes in a way that minimizes the risk of damage to the flexible semiconductor device package.

After transportation and assembly process are completed, the rigid substrate and the flexible semiconductor device package are separated by releasing them from the adhesive by a method such as exposing the adhesive to ultraviolet light or irradiating the adhesive. The flexible semiconductor device package separated from the rigid substrate may be bent as required because the flexible semiconductor device package is mainly composed of material having a low elastic modulus. Therefore, the flexible semiconductor device package may be protected during assembly process by the rigid substrate, to improve yield and reliability of the products which incorporate the package.

Hereinafter, an example of the semiconductor device carrier 1000 will be described in detail with reference to FIG. 1.

The semiconductor device carrier 1000 includes the flexible semiconductor device package 100, an adhesive 110 and a rigid substrate 120.

The flexible semiconductor device package 100 may include a substrate 10, chips 20, conductive elements 30, an encapsulation member ("encapsulant") 40, and external electrical terminals such as solder bumps 50. The flexible semiconductor device package 100 may be employed by any wearable technology, for example, a wrist-worn electronic device such as a smart wristwatch, a wrist band or the like, a necklace-type electronic device, an eyeglass-type electronic device, etc. The term "wearable technology" thus will be understood by those of ordinary skill in the art as referring to the well known class of devices that include such components as microprocessors and a power source (a battery or batteries) and which may be configured as a fashion accessory but in any case have functions for personal or business use and/or monitoring of health or location or the like, as opposed to technology that is to be merely carried or is stationary.

Accordingly, the substrate 10 may be a flexible substrate well known per se in the art, e.g., the substrate 10 may comprise a flexible base film of PI, PEN, PEEK, PET, glass fiber reinforced epoxy, or prepreg. Thus, the term "flexible" as used in connection with the substrate will be well understood by those of ordinary skill in the art as referring to a substrate or film that can be bent substantially into a curved form without cracking or breaking. The substrate 10 also includes wiring structure (not shown) disposed on and extending through the base film and electrically connecting the conductive elements 30 and the external terminals, e.g., solder bumps. In this respect, the substrate 10 may include conductive traces and vias, as are known in the art per se to electrically connect the conductive elements 30 and the external terminals. The substrate 10 may have a thickness of less than 200 μm to ensure the flexibility of the semiconductor package and good curved surface fitting performance. However, the inventive concept is not limited to any particular type or dimension of flexible substrate for the package 100.

The (base film of the) substrate 10 and the rigid substrate 120 may be juxtaposed and oriented as substantially parallel to each other (i.e., with the major surfaces thereof flat and parallel to each other).

The chips 20 are disposed on the substrate 10 as spaced laterally from each other (as opposed to stacked), and chip pads may be disposed on (active) surfaces of the chips 20. The chips 20 may be electrically connected to the substrate 10 via the chip pads and the conductive elements 30. The chips are of types that perform functions in the particular end product, e.g., in the particular wearable technology. For example, at least one of the chips may comprise a microprocessor. In this example, each chip 20 has a surface area or footprint less than half that of the substrate 10 and have a thickness of between 200 μm and 10 μm, and thus the chips 20 remain well fit to the substrate 10 during bending of the flexible semiconductor device package.

The conductive elements 30 electrically connect the chips 20 to the substrate 10. The conductive elements 30 may be curved bonding wires having concave portions and convex portions. As such, the conductive elements 30 will not break when extended by relatively large amounts while the flexible semiconductor device package 100 is bent inwardly or outwardly, and thus the reliability of the flexible semiconductor device package 100 is ensure. In another example, the conductive elements 30 are bumps such as solder bumps or copper bumps, and the chips 20 are connected to the substrate 10 in a flip-chip manner via chip pads and the conductive elements 30. In this case, the conductive elements 30 may be of a conductive epoxy resin.

Figure 2:
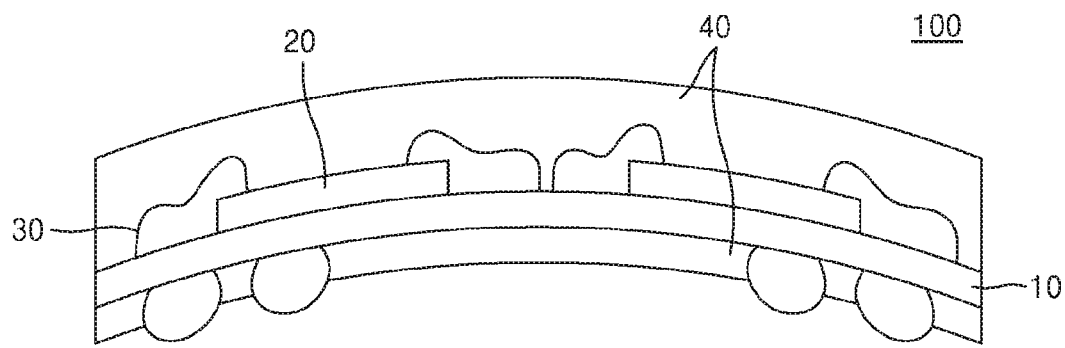
FIG. 2 is a cross-sectional view of a flexible semiconductor device package of an article of manufacture according to the inventive concept.
Figure 3:
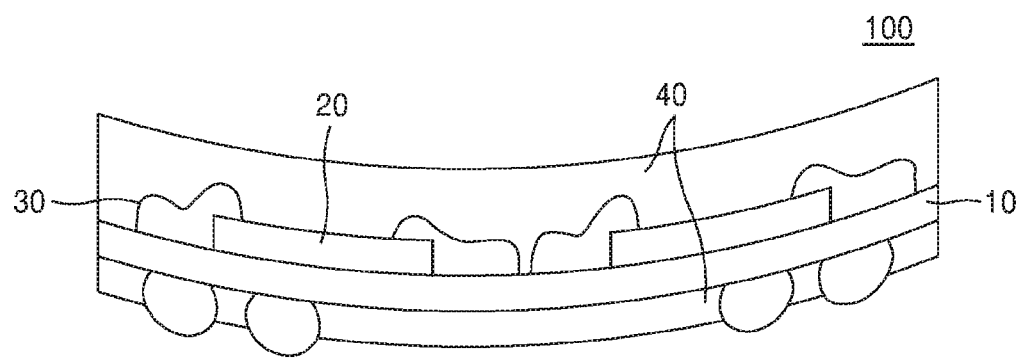
FIG. 3 is a cross-sectional view of a flexible semiconductor device package of an article of manufacture according to the inventive concept.

The encapsulation member 40 may be disposed on the upper surface of the substrate 10 and may further be disposed on the lower surface of the substrate 10. That is, the encapsulation member 40 may be disposed at both sides of the substrate 10 so as to cover and thereby protect the conductive elements 30 and the chips 20 and to reduce the risk of chip damage. The encapsulation member 40 is disposed on both sides of the substrate 10 to achieve a stress balance, and thus the internal stress due to mismatching of the thermal expansion coefficient is minimized to ensure the flexibility of the flexible semiconductor device package 100. In the present example, the flexible semiconductor device package 100 may bent outwardly into an upwardly convex structure as shown in FIG. 2, and may also bent inwardly into an upwardly concave structure as shown in FIG. 3. As shown in FIGS. 2 and 3, when the flexible semiconductor device package 100 is in a curved state, i.e., curved about a horizontal plane so as to be symmetrical with respect to a line on such plane, the top and bottom surfaces of the chips 20 may not be horizontal. The flexible semiconductor device package 100 having the flexible substrate and the flexible encapsulation member 40 may be bent to an extent required to conform to a surface against which the flexible semiconductor device package 100 is to be disposed, e.g., to conform to contours of a portion of a human body in the case in which the package 100 is employed in a wearable device, so as to exhibit a fitting performance that may not include plastic deformation of the flexible semiconductor device package 100.

The encapsulation member 40 may be of flexible encapsulation material known in the art per se. Preferably, the encapsulation member 40 may be of a low modulus elasticity material with an $SiO_2$ content of less than 50 wt %, an elastic modulus less than 2 GPa, and elongation of greater than 10%. In another example, the encapsulation member 40 may be of a known and suitable plastic encapsulation material. In addition, the encapsulation member 40 may protect the chips 20 from external environmental conditions (e.g., moisture and/or air).

The solder bumps 50 may be disposed on the lower surface of the substrate 10 and may be physically connected to the substrate 10 at least in part by the flexible encapsulation member 40. A plurality of solder bumps 50 may be formed using methods commonly used in the art. In the present example, the solder bumps 50 are solder balls. The solder bumps 50 are electrically connected to the chips 120 by the substrate 10.

The adhesive 110 is disposed on the encapsulation member 40 located on the upper surface of the substrate 10. In an example according to the inventive concept, the adhesive 110 is a photosensitive adhesive that reacts to light of a given wavelength (e.g., UV glue). When the adhesive 110 is a photosensitive adhesive, the adhesive force of the photosensitive adhesive can be reduced (in effect destroyed) by light of a given wavelength, e.g., ultraviolet light or laser light. Thus, the rigid substrate 120 can be separated from the flexible semiconductor device package 100 by irradiating the photosensitive adhesive with UV rays or a laser.

The rigid substrate 120 in this example consists of a plate-like element of rigid material. Here, the term "rigid substrate" will be understood as referring to a substrate that is not pliant and can undergo substantially no elastic deformation. The material of the rigid substrate 120 may be transparent. For example, the rigid substrate 120 may be a transparent glass plate comprising $SiO_2$, borate, phosphate or the like which does not absorb ultraviolet light. The rigid substrate 120 may temporarily protect the flexible semiconductor device package 100 from excessive bending and deformation during transport and assembly processes (described in more detail later on with reference to FIG. 4). After transportation and broad level assembly, the rigid substrate 120 and the flexible semiconductor device package 100 are separated by an adhesive removing method, such as by exposing the adhesive to ultraviolet light or a laser beam through the substrate 120. Therefore, it is possible to avoid producing defects in the flexible semiconductor device package due to deformation thereof during processing and transportation, thereby improving the yield of the products. Also, the flexible semiconductor device package may be protected during an assembly process by the rigid substrate, to improve the yield and the durability of the products being manufactured.

Figure 4:
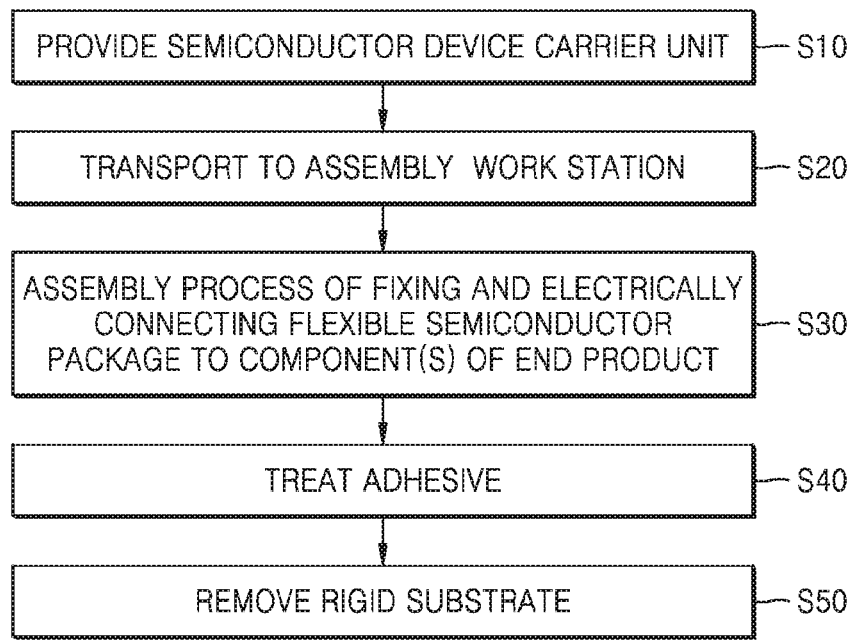
FIG. 4 is a flow chart of an example of a method of manufacturing an electronic product including a flexible semiconductor device package according to the inventive concept.

FIG. 4 illustrates a method of manufacturing an electronic product having a flexible semiconductor device package, according to the inventive concept.

Referring to FIGS. 1-4, a semiconductor device carrier or manufacturing unit 1000 is provided (S10). The semiconductor device carrier or manufacturing unit 1000 may be provided by providing the flexible semiconductor device package 100 shown in and described with reference to FIGS. 2 and 3. Thus, the package 100 includes a flexible substrate 10 comprising a base film, at least one semiconductor chip 20 disposed on the base film and an encapsulant 40 covering the semiconductor chip (s) 20. Then at least one of the rigid substrate 120 (e.g., plate) and the encapsulant 40 is/are coated with the adhesive 110, and the rigid substrate 120 and the encapsulant are set against each other with the adhesive 110 interposed therebetween and with the rigid substrate 120 and the flexible substrate 10 of the semiconductor package 100 juxtaposed and oriented generally parallel to one another. For example, as shown in FIG. 1, the rigid substrate 120 is set along an exposed upper surface of the surface of the encapsulant 140 with the adhesive 110 interposed therebetween. Thus, the rigid substrate 120 and the flexible semiconductor device package are secured together forming the semiconductor device package carrier or manufacturing unit 1000.

As result, a bending of the flexible semiconductor device package 100 is suppressed by the rigid substrate 120.

Next, the semiconductor device package carrier or manufacturing unit 1000 is transported to a work station (S20). In this respect, conventional semiconductor device handling equipment, i.e., robotic transfer equipment, may be used.

The semiconductor device package manufacturing or carrier unit is assembled to one or more components at the work station (S30). Here the assembly may include a physical and/or electrical connecting of the flexible semiconductor device package 100 to a component(s) constituting the final electronic product, e.g., a flexible covering, battery, etc. (S30). Thus, the work station may include automated assembly equipment customized to physically and/or electrically connect components of the end product, e.g., the wearable technology, to one another.

Then the rigid substrate 120 (plate) is removed from the flexible semiconductor device package 100, i.e., while the flexible semiconductor device package 100 is in a state in which it is assembled to the component(s). Therefore, the flexible semiconductor device package 100 may be prevented from being damaged during the assembly process. In this example, the adhesive 110 is treated (S40) to destroy its adhesive property, and then the rigid substrate 102 is removed from the flexible semiconductor device package 100 (S50). As described above, this may be accomplished by irradiating the adhesive 110 through the rigid substrate 120 in the case in which the adhesive 110 is a photosensitive adhesive and the rigid substrate 120 is transparent.

As a result, the flexible semiconductor device package 100 is freed and allowed to once again bend to conform to the contour of, for example, the body part against which it will be worn.

As described above, according to the inventive concept, a flexible semiconductor device package is prevented from being damaged through excessive flexing and deformation during transport and/or assembly into an end product such as wearable technology. In particular, properties such as high transmission bandwidth, high heat dissipation, and high reliability of the flexible semiconductor device package can be maintained. Thus, the end products that require the flexible semiconductor device package can be made at a high yield, i.e., at a relatively low cost per unit.

Although one or more examples of the inventive concept have been described with reference to the drawings, it will be understood by those skilled in the art that various changes in form and detail may be made to such examples without departing from the spirit and scope of the inventive concept defined by claims.

What is claimed is:

1. A method of manufacturing an electronic product, the method comprising:
    providing a manufacturing unit including a flexible semiconductor device package and a rigid substrate attached to the flexible semiconductor device package by adhesive;
    assembling the manufacturing unit to one or more other components constituting the electronic product, and
    subsequently releasing the rigid substrate from the flexible semiconductor device package by treating the adhesive,
    wherein the adhesive is a photosensitive adhesive, and the rigid substrate is transparent, and the treating of the adhesive comprises irradiating the adhesive through the rigid substrate,
    wherein the flexible semiconductor device package includes a base film, at least one semiconductor chip disposed on the base film and an encapsulant covering the at least one semiconductor chip, and
    wherein the providing of the manufacturing unit includes coating at least one of the group of rigid substrate and the encapsulant with the adhesive, and disposing the rigid substrate and the encapsulant against each other with the adhesive interposed therebetween and with the rigid substrate and the base film juxtaposed and oriented generally parallel to one another.

2. The method of claim 1, wherein the base film is of material selected from the group consisting of PI, PET, PEN, PEEK, glass fiber reinforced epoxy, and prepreg.

3. The method of claim 1, wherein the encapsulant is of material having an elastic modulus of less than 2 GPa.

4. The method of claim 1, wherein the one or more other components comprise one or more components of wearable technology.

5. A method of manufacturing an electronic product, the method comprising:

providing a semiconductor device package including a base film, at least one semiconductor chip disposed on the base film, external terminals disposed on the base film and electrically connected to each said at least one semiconductor chip, and an encapsulant disposed on the base film and covering the at least one semiconductor chip;

attaching a plate to the semiconductor device package along a surface of the encapsulant to thereby form a semiconductor device carrier unit in which flexing of the semiconductor device package is suppressed;

transporting the semiconductor device carrier unit to a work station;

assembling the semiconductor device carrier unit to one or more other components of the electronic product at the work station; and subsequently removing the plate from the semiconductor device package.

6. The method of claim 5, wherein the semiconductor device package provided has the at least one semiconductor chip disposed on an upper surface of the base film and the encapsulant extending on the upper surface of the base film, said surface of the encapsulant along which the plate is attached extends over the upper surface of the base film, and the plate is attached to the semiconductor device package, along said surface of the encapsulant, with the plate and the base film of the semiconductor package oriented substantially parallel to one another.

7. The method of claim 5, wherein the attaching of the plate to the semiconductor device package comprises providing adhesive on the surface of the encapsulant.

8. The method of claim 7, wherein the plate is transparent to light of a given wavelength, the adhesive is photosensitive to the light of the given wavelength, and the removing of the plate comprises irradiating the adhesive through the plate with light of the given wavelength.

9. The method of claim 5, wherein the base film of the semiconductor device package is of material selected from the group consisting of PI, PET, PEN, PEEK, glass fiber reinforced epoxy, and prepreg.

10. The method of claim 8, wherein the base film has a thickness of less than 200 μm.

11. The method of claim 5, wherein the encapsulant is of material having an elastic modulus of less than 2 GPa.

12. The method of claim 5, wherein the one or more other components of the electronic product to which the semiconductor device carrier unit is or are assembled comprise one or more components of wearable technology.

* * * * *